(12) United States Patent
Luan (10) Patent No.: US 9,923,020 B2
(45) Date of Patent: Mar. 20, 2018

(54) CAMERA MODULE AND METHOD OF MANUFACTURING THE SAME

(71) Applicant: STMicroelectronics (Shenzhen) R&D Co. Ltd, Shenzhen (CN)

(72) Inventor: Jing-En Luan, Shenzhen (CN)

(73) Assignee: STMICROELECTRONICS (SHENZHEN) R&D CO., LTD., Shenzhen (CN)

( * ) Notice: Subject to any disclaimer, the term of this patent is extended or adjusted under 35 U.S.C. 154(b) by 53 days.

(21) Appl. No.: 14/750,859

(22) Filed: Jun. 25, 2015

(65) Prior Publication Data

US 2015/0380454 A1 Dec. 31, 2015

(30) Foreign Application Priority Data

Jun. 27, 2014 (CN) .......................... 2014 1 0305618

(51) Int. Cl.
*H01L 27/146* (2006.01)
*H04N 5/369* (2011.01)
*H01L 23/00* (2006.01)
*H04N 5/225* (2006.01)

(52) U.S. Cl.
CPC ........ *H01L 27/14685* (2013.01); *H01L 24/97* (2013.01); *H01L 27/14618* (2013.01); *H04N 5/2257* (2013.01); *H04N 5/369* (2013.01); *H01L 2224/16225* (2013.01); *H01L 2224/48095* (2013.01); *H01L 2224/48227* (2013.01)

(58) Field of Classification Search
CPC ........ H04N 5/2257; H04N 5/225; H04N 5/20; H04N 5/52; H01L 27/14685; H01L 27/14618

USPC ............ 348/211.9, 266, 275, 294, 300, 302, 348/373–376; 438/64; 257/294
See application file for complete search history.

(56) References Cited

U.S. PATENT DOCUMENTS

| 7,059,040 B1* | 6/2006 | Webster ................... G02B 7/02 257/E31.118 |
| 9,029,759 B2* | 5/2015 | Singh ................ H01L 27/14618 250/208.1 |
| 2007/0018309 A1* | 1/2007 | Chang ................. H01L 21/6836 257/704 |
| 2007/0178630 A1* | 8/2007 | Huang .............. H01L 27/14618 438/116 |

(Continued)

FOREIGN PATENT DOCUMENTS

| CN | 101901791 A | 12/2010 |
| CN | 103681713 A | 3/2014 |
| CN | 204243041 U | 4/2015 |

*Primary Examiner* — Antoinette Spinks
(74) *Attorney, Agent, or Firm* — Seed IP Law Group LLP (57) ABSTRACT

Embodiments of the present invention provide a camera module and a method of manufacturing the same, the camera module comprising a sensor assembly, at least one semiconductor substrate, and a molding compound; wherein the sensor assembly comprises a semiconductor die, a sensor circuit disposed on the top surface of the semiconductor die, and a transparent cover coupled to the semiconductor die over the top surface of the semiconductor die; wherein each semiconductor substrate is disposed around the sensor assembly in a horizontal direction; and wherein the molding compound is filled between each semiconductor substrate and the sensor assembly.

22 Claims, 8 Drawing Sheets

(56) References Cited

U.S. PATENT DOCUMENTS

| | | | |
|---|---|---|---|
| 2008/0274579 A1* | 11/2008 | Yang | H01L 27/14618 438/64 |
| 2010/0323469 A1* | 12/2010 | Borthakur | H01L 21/76898 438/65 |
| 2011/0147908 A1* | 6/2011 | Sun | H01L 23/3128 257/686 |
| 2016/0241749 A1* | 8/2016 | Alasimio | H04N 5/2257 |

* cited by examiner

CAMERA MODULE AND METHOD OF MANUFACTURING THE SAME

BACKGROUND

Technical Field

Embodiments of the present invention relate to a camera module, and more specifically, to a chip-level encapsulated camera module for an optical sensor device having a low height, and a method of manufacturing the same.

Description of the Related Art

A challenge faced by a designer for coupling the optical sensor to a camera circuit is that the device must be located on a substrate and the optical sensor faces outwards, and no obstacles that likely interfere with reception of the optical images exist. Because the camera module is more frequently used in a small electronic device (such as a mobile phone and a tablet computer), it is desired to lower the height of the camera module such that they can be mounted in a thinner device.

Figure 1:
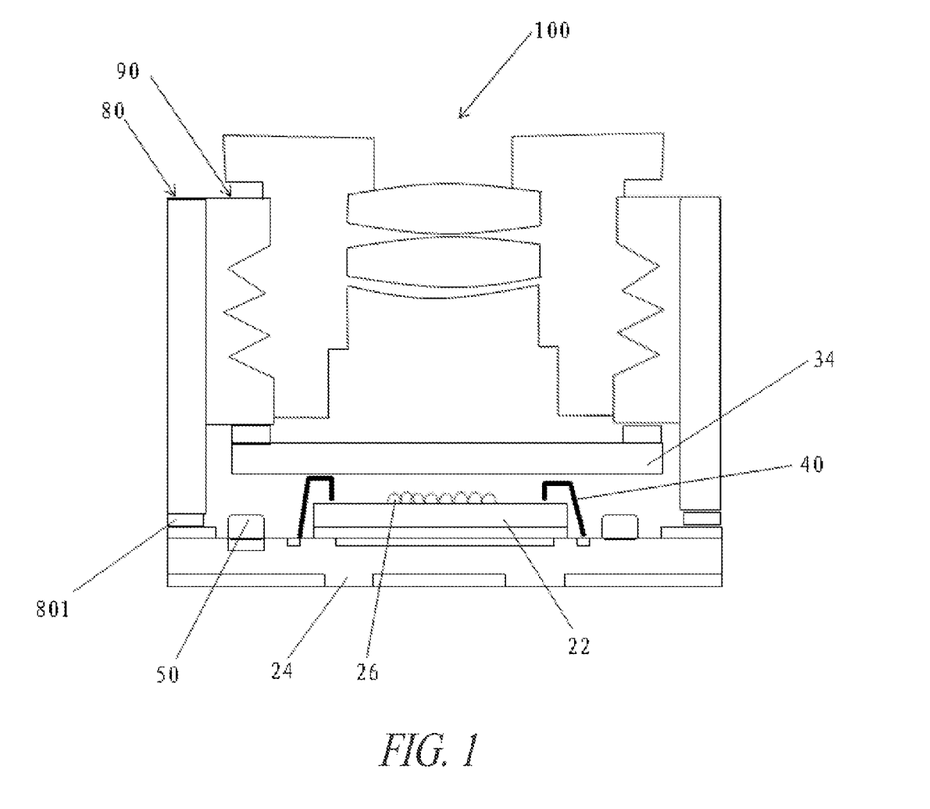
FIG. 1 shows a cross-sectional view of a camera module according to the prior art.

FIG. 1 shows a known camera module having a semiconductor die 22. An optical sensor circuit 26 is formed on the top surface of the semiconductor die 22. The semiconductor die 22 is mounted onto a semiconductor substrate 24, and a bonding wire 40 couples the sensor circuit 26 to a circuit in the semiconductor substrate 24. A lens assembly comprises a lens cone 80, a lens carrier 90, and a lens array 100 comprising one or more lens. The lens assembly may be coupled to the top surface of the semiconductor substrate 24 through an adhesive agent 801. Besides, a surface mount device 50 may also be mounted on the top surface of the semiconductor substrate 24.

It may be seen that an example of the camera module of FIG. 1 has the following problems. Because the semiconductor die 22 is disposed on the semiconductor substrate 24, and the sensor circuit 26 is electrically coupled to the circuit in the semiconductor substrate 24, such that it is not satisfactory when being used in a small electronic device, because the laminated semiconductor die 22 and semiconductor substrate 24 limit a minimum thickness of this kind of device.

BRIEF SUMMARY

In view of the drawbacks existing in the prior art, one of the objectives of the embodiments of the present invention is providing a camera module with a low thickness and a method for manufacturing such a camera module.

According to one aspect of the present invention, there is provided a camera module that includes a sensor assembly, a semiconductor substrate horizontally adjacent to the sensor assembly and a molding compound between them. The sensor assembly is composed of a semiconductor die, a sensor circuit disposed on the top surface of the semiconductor die, and a transparent cover coupled to the semiconductor die over the top surface of the semiconductor die. There is a semiconductor substrate disposed around the sensor assembly in a horizontal direction. A molding compound is positioned between each semiconductor substrate and the sensor assembly.

According to one exemplary embodiment of the present invention, the semiconductor die comprises at least one through silicon via electrically coupled to the sensor circuit, and each through silicon via is electrically coupled to a circuit in a corresponding semiconductor substrate from the bottom surface of each semiconductor substrate via a bonding wire, respectively; and the molding compound at least further covers each bonding wire and the bottom surface of the semiconductor die.

According to one exemplary embodiment of the present invention, the camera module further comprises at least one surface mount device, each surface mount device being electrically coupled to the circuit in the corresponding semiconductor substrate from the top surface of each semiconductor substrate.

According to one exemplary embodiment of the present invention, the transparent cover is aligned with the semiconductor die in the horizontal direction.

According to one exemplary embodiment of the present invention, the top surface of each semiconductor substrate is flush with the top surface of the transparent cover, respectively.

According to one exemplary embodiment of the present invention, the bottom surface of each semiconductor substrate is flush with the bottom surface of the semiconductor die, respectively.

According to one exemplary embodiment of the present invention, the top surface of the molding compound is flush with the top surface of the transparent cover.

According to one exemplary embodiment of the present invention, the camera module further comprises a lens assembly coupled to the top surface of the at least one semiconductor substrate.

According to one exemplary embodiment of the present invention, the number of the semiconductor substrate is two, the two semiconductor substrates being disposed on opposite sides of the sensor assembly in the horizontal direction, respectively.

According to one exemplary embodiment of the present invention, the number of the semiconductor substrate is one, whose cross-sectional shape is a hollow square, and the sensor assembly is located inside the semiconductor substrate.

According to one exemplary embodiment of the present invention, the sensor assembly is disposed centrally within the semiconductor substrate.

According to one exemplary embodiment of the present invention, the transparent cover is a glass having an IR coating or a UV coating.

According to a further aspect of the present invention, there is provided a method of manufacturing a camera module, as follows. Locating alternately a plurality of sensor assemblies and a plurality of semiconductor substrates on a carrier layer at a predetermined spacing; wherein each sensor assembly comprises: a semiconductor die; a sensor circuit disposed on the top surface of the semiconductor die; and a transparent cover coupled to the semiconductor die over the top surface of the semiconductor die; wherein the semiconductor die comprises at least one through silicon via electrically coupled to the sensor circuit, wherein the transparent cover is close to the carrier layer; and wherein the top surface of the semiconductor substrate is close to the carrier layer. Next, electrically coupling each through silicon via to a circuit in a corresponding semiconductor substrate from the bottom surface of each semiconductor substrate via a bonding wire, respectively. After this, filling the space between the plurality of semiconductor substrates and the plurality of sensor assemblies with a molding compound. The molding compound at least further covers each bonding wire and the bottom surface of the semiconductor die. The carrier layer is then removed. Each semiconductor substrate is then diced to form a monolithic structure. A final step is the coupling of a lens assembly onto the top surface of the monolithic structure.

According to one exemplary embodiment of the present invention, after removing the carrier layer and before dicing each semiconductor substrate, the method further comprises: mounting, on the top surface of the plurality of semiconductor substrates, surface mount devices electrically coupled to the circuit in the corresponding semiconductor substrate.

According to one exemplary embodiment of the present invention, the transparent cover and the semiconductor die are aligned in a horizontal direction.

According to one exemplary embodiment of the present invention, the thickness of each semiconductor substrate is identical to the thickness of the sensor assembly.

By arranging the sensor assembly and the semiconductor substrate abreast in the horizontal direction, the size of a structure including the semiconductor substrate and the sensor assembly in a vertical direction can be reduced, thereby further reducing the size of the camera module in a vertical direction.

BRIEF DESCRIPTION OF THE SEVERAL VIEWS OF THE DRAWINGS

Hereinafter, the embodiments of the present invention will be described only through examples with reference to the accompanying drawings, wherein corresponding reference numerals are provided for similar components. In the accompanying drawings.

DETAILED DESCRIPTION

Hereinafter, the principle and spirit of the various embodiments will be described with reference to several exemplary embodiments as shown in the accompanying drawings. It should be understood that these embodiments are described only for enabling those skilled in the art to better understand and then further implement the present invention, not intended to limit the scope of the present invention in any manner.

Figure 2:
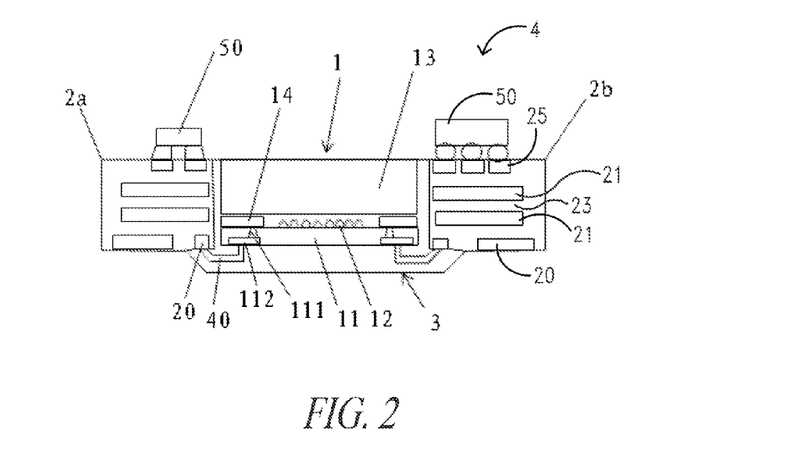
FIG. 2 shows a cross-sectional view of a configuration comprising a sensor assembly, a semiconductor substrate, and a molding compound according to one embodiment of the present invention.

FIG. 2 shows a cross-sectional view of a configuration comprising a sensor assembly 1, semiconductor substrates 2a, 2b, and a molding compound 3 according to one embodiment of the present invention. This configuration may be used for manufacturing a camera module.

In the configuration as shown in FIG. 2, the sensor assembly 1 comprises a semiconductor die 11, an optical sensor circuit 12, and a transparent cover 13. This sensor assembly as shown in FIG. 2 may be manufactured based on a known process in the prior art.

The optical sensor circuit 12 is disposed on the top surface of the semiconductor die 11. A plurality of optical sensor circuits 12 may be formed on the top surface of the semiconductor die 11 according to a known process. In the figure, a structure of a known optical sensor circuit in the art is not illustrated in detail, which, however, is exemplarily shown through a row of micro lens.

The transparent cover 13 may be coupled to the top surface of the semiconductor die 11 through an adhesive agent 14, and a selected space between the transparent cover 13 and the optical sensor circuit 12 is determined by the thickness of the adhesive agent 14. The transparent cover 13 may be provided by a selective transparent coating known in the art, such as IR (infrared) coating or UV (ultraviolet) coating, i.e., the transparent cover 13 may be an IR glass or UV glass. The transparent coating may be deposited on a surface of the transparent cover 13 facing the optical sensor circuit 12. The transparent cover 13 may be aligned with the semiconductor die 11 in the horizontal direction. In other words, the transparent cover 13 may preferably have a size identical to the semiconductor die 11 in the horizontal direction. However, the sizes of the transparent cover 13 and the semiconductor die 11 are not limited to be identical in the horizontal direction. For example, the horizontal size of the transparent cover 13 may be less than or greater than the horizontal size of the semiconductor die 11, as long as the transparent cover 13 can substantially cover the optical sensor circuit 12.

In FIG. 2, as an example, the illustrated configuration comprises two semiconductor substrates 2a, 2b, disposed on two sides of the sensor assembly 1, respectively. The semiconductor substrates 2a, 2b are each an individual semiconductor die. They are made according to known techniques for manufacturing semiconductor dice starting with a large wafer then using masks to implant dopants into a semiconductor substrate, followed by forming subsequent layers of conductors 21 and insulating layers 23 in between the conductors. Transistors will be formed in the active area of the semiconductor substrates 2a, 2b, but are not shown since such formation and structure are well known in the art. There will be proper electrical contacts and vias from the transistors to the various conductive layers 21 and also vias from one conductive layer 21 to another conductive layer 21, but these are not shown to avoid crowding in the figure and also, because such structures and how are formed are very well known in the art. The semiconductor substrates 2a, 2b will have contact pads 25 and 20 on the top and the bottom respectively. The top contact pads 25 and the bottom contact pads 20 being coupled to the appropriate conductive layers 21 with vias, again, not shown since such connections of vias in a semiconductor substrate are well known in the art.

These semiconductor substrates 2a, 2b contain circuits that are useful in processing images from the sensor die 11. For example, they might be microprocessors, memory circuits, interface circuits, controllers or other chips. There are direct contacts from the sensor die 11 to the adjacent semiconductor substrates 2a, 2b using the electrical connection 40 and the contact pad 20, as explained herein. With this structure, the senor assembly 1 can include not only the senor die 11 itself, but also include related processing circuits and other chips that assist in storing and outputting images from the camera module. The distance from the two semiconductor substrates 2a, 2b to the sensor assembly 1 may be selected as required so as to facilitate forming the two semiconductor substrates 2a, 2b and the sensor assembly 1 into an integral structure using a molding compound 3. Compared with disposing the sensor assembly on the top surface of the semiconductor substrate in the prior art, the arrangement of the sensor assembly and the semiconductor substrate may be implemented in a different manner in the present embodiment. Specifically, the sensor assembly 1 and the semiconductor substrates 2a, 2b are disposed abreast in the horizontal direction, so as to reduce the height of the above configuration in the vertical direction, and therefore further reduce the size of the camera module in the vertical direction. Although two semiconductor substrates 2a, 2b are shown in the figure as an example, those skilled in the art may conceive of other number of semiconductor substrates, as long as they are disposed around the sensor assembly in the horizontal direction so as to form a horizontal arrangement with the sensor assembly, as described in detail infra.

In the example as shown in FIG. 2, the top surfaces of the two semiconductor substrates 2a, 2b are substantially co-planar with the top surface of the transparent cover 13, and the bottom surfaces of the two semiconductor substrates 2a, 2b are substantially co-planar with the bottom surface of the semiconductor die 11. In other words, the thickness of the two semiconductor substrates 2a, 2b is substantially identical to the thickness of the sensor assembly 1, i.e., the distance from the top surface of the transparent cover 13 to the bottom surface of the semiconductor die 11. However, in various embodiments, the thickness of two semiconductor substrates 2a, 2b and the thickness of the sensor assembly 1 are not limited to being identical to each other; instead, the thickness of the two semiconductor substrates 2a, 2b may be greater or less than the thickness of the sensor assembly 1. For example, when the top surfaces of two semiconductor substrates 2a, 2b are substantially co-planar with the top surface of the transparent cover 13, respectively, the bottom surface of the sensor assembly 1 (i.e., the bottom surface of the semiconductor die 11) may be higher or lower than the bottom surfaces of the two semiconductor substrates 2a, 2b in a vertical direction. Further, when the bottom surfaces of the two semiconductor substrates 2a, 2b are substantially co-planar with the bottom surface of the semiconductor die 11, respectively, the top surface of the sensor assembly 1 (i.e., top surface of the transparent cover 13) may be higher than or lower than the top surfaces of the two semiconductor substrates 2a, 2b in a vertical direction.

Hereinafter, electrical coupling between the sensor circuit 12 and the circuit in the semiconductor substrates 2a, 2b will be described in detail with reference to the accompanying drawings. In the configuration as shown in FIG. 2, the semiconductor die 11 may include one or more (e.g., two as shown in the figure) through silicon vias (TSV) 111. The through silicon via 111 is used for providing an electrically conductive path from the top surface to the bottom surface of the semiconductor die 11. The top end of the through silicon via 111 is electrically connected to the optical sensor circuit 12, and the bottom end of the through silicon via 11 may extend to the bottom surface of the semiconductor die 11 or extend to a contact pad 112 at the bottom surface of the semiconductor die 11. In this embodiment, the bottom end of the through silicon via 111 is electrically coupled to the contact pad 112 at the bottom surface of the semiconductor die 11. At the bottom surfaces of the two semiconductor substrates 2a, 2b, a contact pad 20 electrically coupled to the circuit in the semiconductor substrates 2a, 2b is also disposed, respectively. Two contact pads 112 at the bottom surface of the semiconductor die 11 are electrically connected to a corresponding contact pad 20 at the bottom surface of the two semiconductor substrates 2a, 2b via the bonding wire 40, respectively. Through use of the through silicon via 111, contact pad 112, bonding wire 40, and contact pad 20, electrical coupling from the optical sensor circuit 12 in the sensor assembly 1 to the circuit in the semiconductor substrates 2a, 2b is established.

Figure 8:
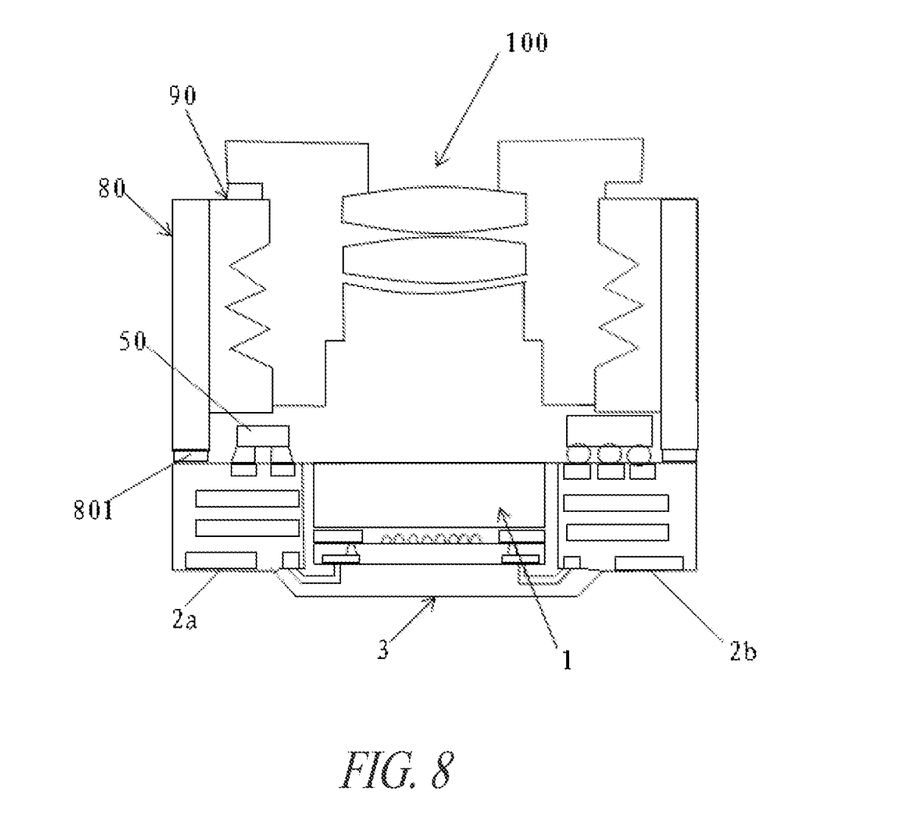
FIG. 8 shows a cross-sectional view of a camera module comprising the configuration as shown in FIG. 2.

In the configuration as shown in FIG. 2, the molding compound 3 is filled between the sensor assembly 1 and two semiconductor substrates 2a, 2b. The molding compound 3 is a material for encapsulating the semiconductor device in many different encapsulation processes, which is a typical compound material formed by mixing various components (such as resin, hardener, silicon oxide, catalyst, fuel, and isolator agent) and is usually provided in a substantial liquid form having a selected adhesive degree, such that they can be injection molded or casted. The molding compound 3 is available in a very broad scope from different manufacturers and satisfying many different standards. Therefore, the term "molding compound" is broadly regarded to be applied to all such compounds. By filling the molding compound 3 between the two semiconductor substrates 2a, 2b and the sensor assembly 1, the two semiconductor substrates 2a, 2b and the sensor assembly 1 may form an integral structure, so as to be used in the subsequent process in manufacturing the camera module as shown in FIG. 8.

In this embodiment, the top surface of the molding compound 3 is substantially in flush with top surfaces of the two semiconductor substrates 2a, 2b and the transparent cover 13. However, in various embodiments, the top surface of the molding compound 3 may be slightly higher or lower than the top surfaces of the two semiconductor substrates 2a, 2b and the transparent cover 13, as long as the reception of the optical image by the optical sensor circuit 12 is not affected, and the two semiconductor substrates 2a, 2b and the sensor assembly 1 can be formed into an integral structure. Besides, in this embodiment, the molding compound 3 further covers a part of the bottom surface of the semiconductor die 11 and the bottom surfaces of the two semiconductor substrates 2a, 2b, to encapsulate the contact bonding pad 20, the bonding wire 40, and the contact bonding pad 112 into the molding compound 3, thereby isolating the configuration as shown in FIG. 2 from electrical coupling to the outside from the bottom surface.

Besides, in the configuration of FIG. 2, there further comprises one or more surface mount devices 50 mounted on the top surfaces of the two semiconductor substrates 2a, 2b, respectively, which surface mount device 50 is electrically coupled to the circuit in the two semiconductor substrates 2a, 2b. The surface mount device 50 illustratively shown in FIG. 2 may comprise any one of various kinds of structures, such as a passive circuit component (e.g., resistor, capacitor, inductor, etc.) and additional integrated circuit (e.g., image processor, voltage stabilizer, and driver for lens control, etc.). Based on specific requirements of various embodiments, the size, shape, and number of the surface mount device 50 may be specifically changed.

Hereinafter, the manufacturing process of the configuration of FIG. 2 will be described in detail with reference to FIGS. 3 to 7.

Figure 3:
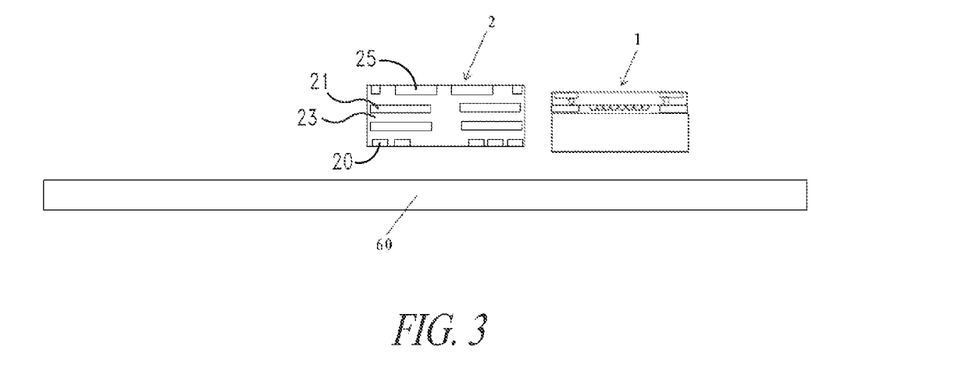
FIGS. 3-7 show cross-sectional views of corresponding phases of manufacturing the configuration as shown in FIG. 2.
Figure 4:
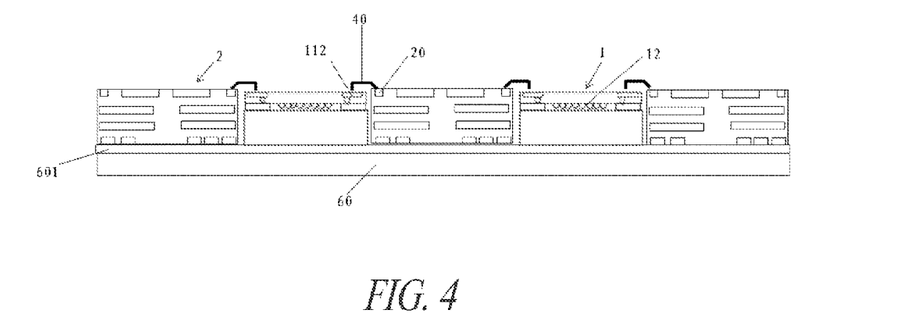

First, as shown in FIG. 3, the semiconductor substrate 2 and the sensor assembly 1 are inverted and positioned alternately on the carrier layer 60 at a predetermined spacing, thereby forming the structure as shown in FIG. 4. In other words, the semiconductor substrate 2 and the sensor assembly 1 can be positioned on the carrier layer 60 with the top surfaces thereof downward through the adhesive agent 601. The semiconductor substrate 2 includes the circuit structure in the two semiconductor substrates 2a, 2b in the configuration as described above with reference to FIG. 2, so as to cut the semiconductor substrate 2 in the subsequent process. The structure of the sensor assembly 1 is identical to the structure of the sensor assembly 1 in the configuration as previously described in FIG. 2.

As shown in FIG. 4, the bonding wire 40 is connected between the contact bonding pad 20 at the bottom surface of the semiconductor substrate 2 and the contact bonding pad 112 at the bottom surface of the sensor assemble 1, so as to electrically couple the optical sensor circuit 12 to the circuit in the semiconductor substrate 2.

Figure 5:
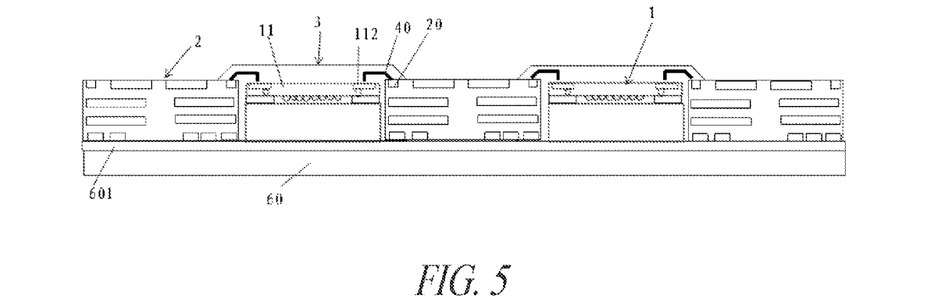

As shown in FIG. 5, a molding compound 3 is filled between the semiconductor substrate 2 and the sensor assembly 1, and the molding compound 3 at least further covers two side portions of the bottom surface of the semiconductor die 11 and the bottom surface of the semiconductor 2, so as to encapsulate the contact bonding pad 20, the bonding wire 40, and the contact bonding pad 112, thereby isolating the contact pad 20, the bonding wire 40, and the contact bonding pad 112 from electrical coupling to the outside. By filling the molding compound 3 between the semiconductor substrate 2 and the sensor assembly 1, an integral structure 4 may be formed between the semiconductor substrate 2 and the sensor assembly 1.

Figure 6:
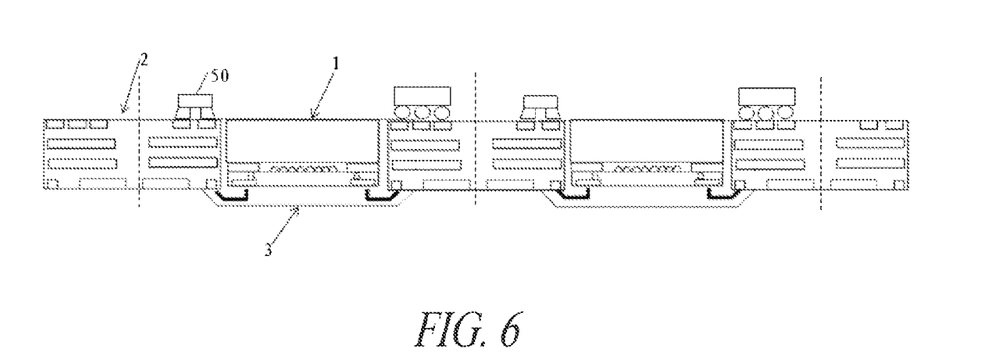

As shown in FIG. 6, the carrier layer 60 is first removed, and then the surface mount device 50 is mounted on the top surface of the semiconductor substrate 2 so as to be electrically coupled to the circuit in the semiconductor substrate.

Figure 7:
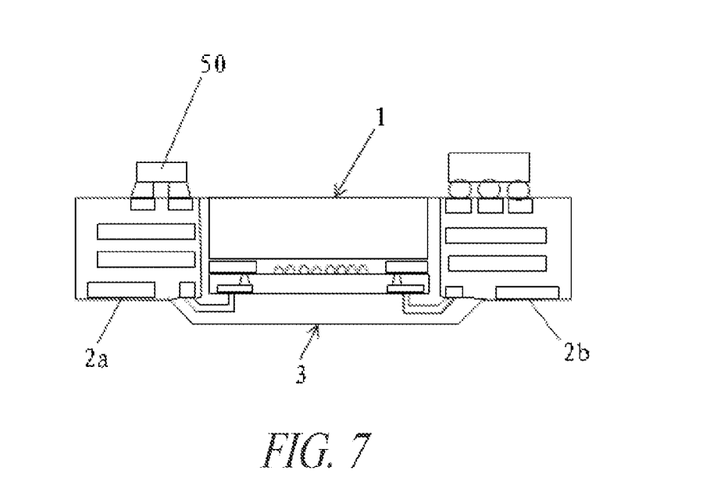

Finally, the semiconductor substrate 2 is cut along the dotted line in FIG. 6 so as to form a monolithic structure, as shown in FIG. 7. The monolithic structure as shown in FIG. 7 is identical to that as shown in FIG. 2.

FIG. 8 shows a cross-sectional view of the camera module including the configuration of FIG. 2. Besides the configuration as shown in FIG. 2, the camera module as shown in FIG. 8 further comprises a lens assembly. The lens assembly comprises a lens cone 80, a lens carrier 90, and a lens array 100 including one or more lens. The lens assembly may adopt the conventional lens assembly in the prior art, whose structure and working principle are known in the art, which will not be detailed here. The lens assembly may be coupled to the top surfaces of the semiconductor substrates 2a, 2b through an adhesive agent 801.

Figure 9:
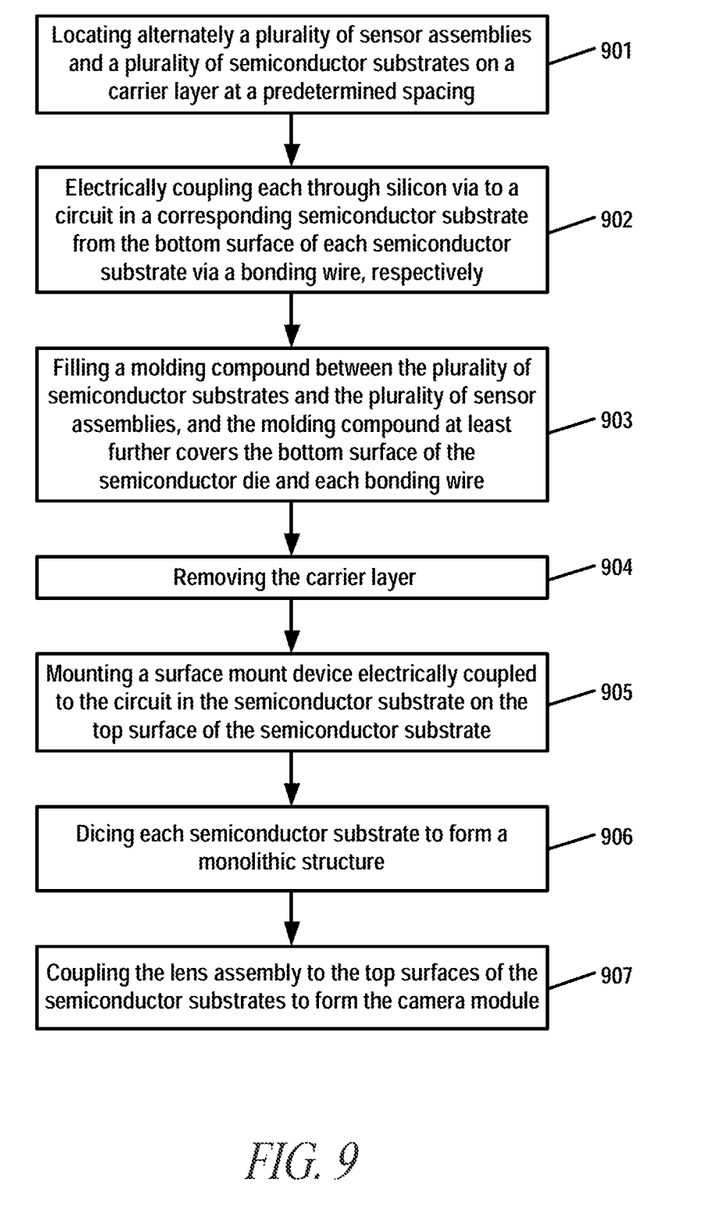
FIG. 9 shows a process flow diagram of manufacturing a camera module according to one embodiment of the present invention.

FIG. 9 shows a process flow diagram of manufacturing a camera module according to one embodiment of the present invention, which is used for manufacturing the camera module as shown in FIG. 8. Because the camera module as shown in FIG. 8 includes the configuration as shown in FIG. 2, and the manufacturing process of the configuration as shown in FIG. 2 has been described above with reference to FIGS. 3 to 7; therefore, the process steps of manufacturing the configuration of FIG. 2 will be incorporated here with reference to FIGS. 3-7.

In step 901, a plurality of sensor assemble 1 and a plurality of semiconductor substrate 2 are alternately positioned on the carrier layer 60 with a predetermined spacing, wherein each sensor assembly 1 comprises: a semiconductor die 11, a sensor circuit 12 disposed on the top surface of the semiconductor die 11; and a transparent cover 13 coupled to the semiconductor die 11 over the top surface of the semiconductor die 11, wherein the semiconductor die 11 comprises at least one through silicon via 111 electrically coupled to the sensor circuit 12, wherein the transparent cover 13 is close to the carrier layer 60; and wherein the top surface of the semiconductor substrate 2 is close to the carrier layer 60.

In step 902, each through silicon via 111 is electrically coupled to the circuit in the corresponding semiconductor substrate 2 from the bottom surface of each semiconductor substrate 2 via the bonding wire 40, so as to electrically couple the optical sensor circuit 12 to the circuit in the semiconductor substrate 2.

In step 903, a molding compound 3 is filled between the semiconductor substrate 2 and the sensor assembly 1, and the molding compound 3 at least further covers the bottom surface of the semiconductor die 11 and each bonding wire 40. For example, with reference to the structure as shown in FIG. 4, the molding compound 3 covers the two side portions of the bottom surface of the semiconductor die 11 and the bottom surface of the semiconductor substrate 2, so as to encapsulate the contact bonding pad 20, the bonding wire 40, and the contact bonding pad 112 into the molding compound 3, thereby isolating the contact bonding pad 20, the bonding wire 40, and the contact bonding pad 112 from electrically coupling to the outside. Moreover, by filling the molding compound 3 between the semiconductor substrate 2 and the sensor assembly 1, the semiconductor substrate 2 and the sensor assembly 1 are thereby formed into an integral structure.

In step 904, the carrier layer 60 is removed.

In step 905, one or more surface mount devices 50 electrically coupled to the circuit in the semiconductor substrate is mounted on the top surface of the semiconductor substrate 2. This step may be omitted based on different needs, e.g., when it is not required to mount any surface mount device 50. Further, two or more surface mount devices may be coupled to the circuit, one each on 2a and 2b.

In step 906, a monolithic structure 4 is formed by dicing each semiconductor substrate 2, i.e., forming the configuration as shown in FIG. 2.

In step 907, the lens assembly is coupled to the top surfaces of the semiconductor substrates 2a, 2b through an adhesive agent 801, thereby finally forming the camera module as shown in FIG. 8.

Figure 10:
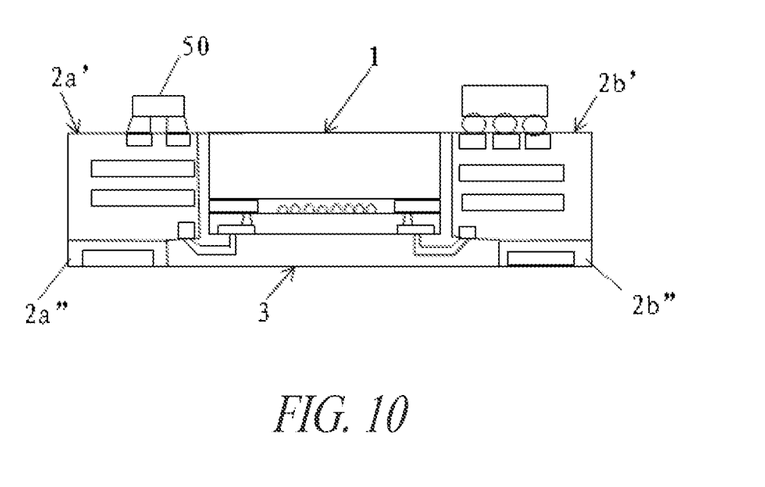
FIG. 10 shows a cross-sectional view of a configuration comprising a sensor assembly, a semiconductor substrate, and a molding compound according to another embodiment of the present invention.

FIG. 10 shows a cross-sectional view of a configuration including a sensor assembly 1, semiconductor substrates 2a, 2b, and a molding compound 3 according to another embodiment of the present invention. The configuration as shown in FIG. 10 differs from the configuration as shown in FIG. 2 only in the bottom structures of the semiconductor substrates 2a, 2b, such that the bottom shape of the molding compound 3 is also different. Here, the features regarding other identical structures will not be described below.

In the configuration as shown in FIG. 10, the semiconductor substrates 2a', 2b' further comprise parts 2a'', 2b'' protruding downward from the bottom surfaces of the semiconductor substrates 2a, 2b in the configuration as shown in FIG. 2. A selected space is formed between the downward protruding parts 2a'', 2b'', and this selected space is also filled using the molding compound 3.

Figure 11:
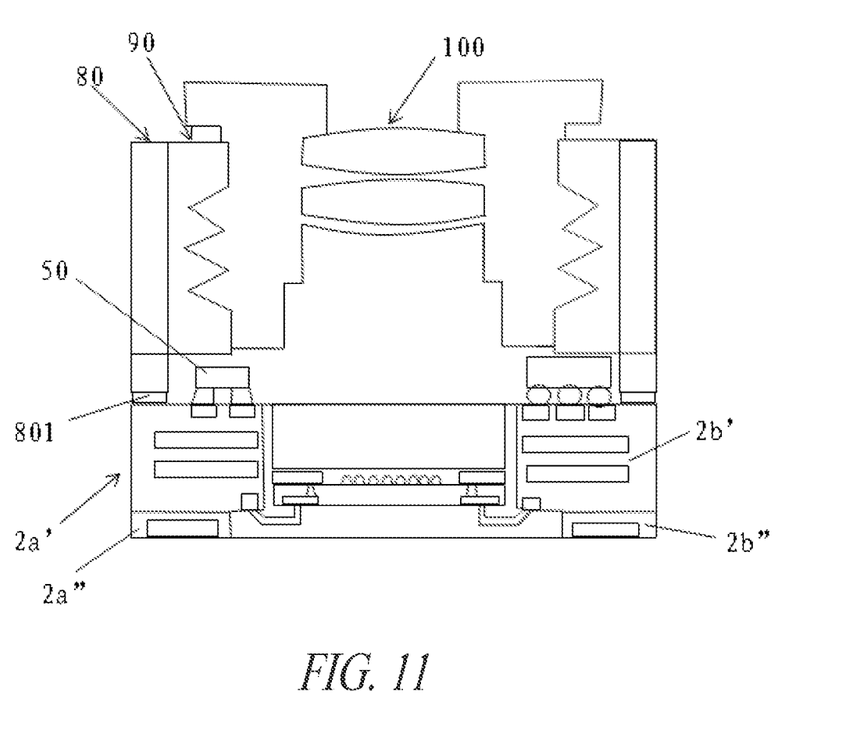
FIG. 11 shows a cross-sectional view of a camera module comprising the configuration as shown in FIG. 10.

FIG. 11 shows a cross-sectional view of the camera module including the configuration of FIG. 10. Besides the configuration as shown in FIG. 10, the camera module as shown in FIG. 11 further comprises a lens assembly. The lens assembly comprises a lens cone 80, a lens carrier 90, and a lens array 100 including one or more lens. The lens assembly may adopt a conventional lens assembly in the prior art, whose structure and working principle are known in the art, which will not be detailed here. The lens assembly may be coupled on the top surfaces of the semiconductor substrates 2a, 2b.

Figure 12:
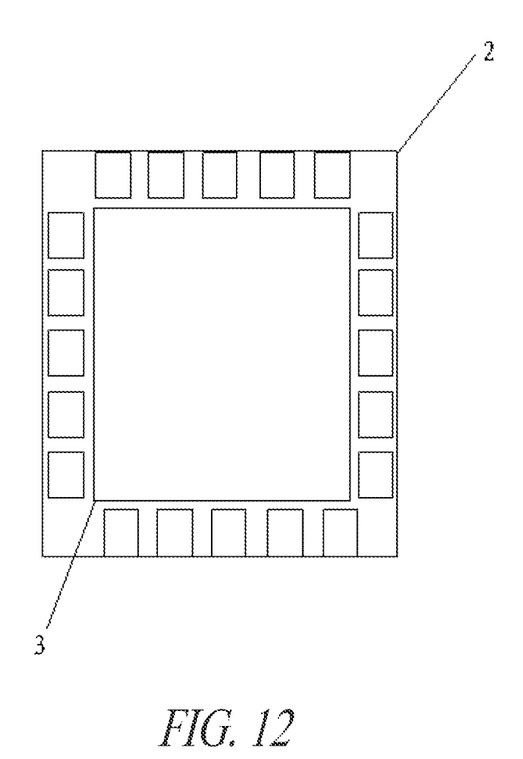
FIG. 12 shows a bottom view of a configuration comprising a sensor assembly, a semiconductor substrate, and a molding compound according to a further embodiment of the present invention.

Although the configurations of FIG. 2 and FIG. 10 only include two semiconductor substrates, the above configuration may also include other number of semiconductor substrates, e.g., one or more. As shown in FIG. 12, when the number of the semiconductor substrate 2 is 1, its cross-sectional shape is a hollow square, i.e., a hollow square structure. The configuration as shown in FIG. 12 differs from the configuration as depicted in the previous embodiments only in that the shape of the semiconductor substrate 2 and the positional relationship between the semiconductor substrate 2 and the sensor assembly 1 are different. The circuit structure of the sensor assembly 1 and the sensor assembly 1 as previously described may have the same structure, and the optical sensor circuit 12 in the sensor assembly 1 may also be electrically coupled to the circuit in the semiconductor substrate 2 from the bottom surface of the semiconductor substrate 2 via a bonding wire. The configuration as shown in FIG. 12 differs from the configuration as described in the previous embodiment in that the sensor assembly 1 is disposed within the semiconductor substrate 2, e.g., the sensor assembly 1 may be disposed centrally in the semiconductor substrate 2, and the molding compound 3 fills the space between the semiconductor substrate 2 and the sensor assembly 1 and covers a part of the bottom surface of the sensor assembly 1 and the bottom of the semiconductor substrate 2. When the number of semiconductor substrates is 3, the three semiconductor substrates, for example, may be disposed on three sides of the sensor assembly 1, respectively.

By arranging the sensor assembly and the semiconductor substrate abreast in the horizontal direction, the size of the structure comprising the semiconductor substrate and the sensor assembly in the vertical direction can be reduced, and further, the size of the camera module in the vertical direction can be further reduced.

The description of the present invention has been provided for the purpose of illustration and description. However, it does not intend to exhaust or limit the invention in the disclosed manner. Those skilled in the art would conceive of many modifications and variations. Therefore, the embodiments are selected and described to better illustrate the principle and actual application of the present invention and enable others among those skilled in the art to understand the following contents. In other words, without departing from the spirit of the present invention, all modifications and replacements will fall within the protection scope of the present invention as defined in the appended claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A camera module, comprising:
   a sensor assembly having:
      a semiconductor die having a first surface and a second surface;
      a sensor circuit disposed on the first surface of the semiconductor die; and
      a transparent cover coupled to the semiconductor die over the first surface of the semiconductor die, the transparent cover having a first surface and a second surface, the second surface of the transparent cover facing the first surface of the semiconductor die;
   at least one semiconductor substrate disposed lateral to the sensor assembly in a horizontal direction, the at least one semiconductor substrate having a first surface and a second surface, the at least one semiconductor substrate positioned such that
      the first surface of the at least one semiconductor substrate is substantially co-planar with the first surface of the transparent cover, and
      the second surface of the at least one semiconductor substrate is substantially co-planar with the second surface of the semiconductor die; and
   a molding compound filled between the at least one semiconductor substrate and the sensor assembly.

2. The camera module according to claim 1 wherein:
   the semiconductor die comprises at least one through via electrically coupled to the sensor circuit, and each through via is electrically coupled to a circuit in a corresponding semiconductor substrate from the second surface of each semiconductor substrate via a bonding wire, respectively; and
   the molding compound at least further covers each bonding wire and the second surface of the semiconductor die.

3. The camera module according to claim 2, further comprising at least one surface mount device, each surface mount device being electrically coupled to the circuit in the corresponding semiconductor substrate from the first surface of each semiconductor substrate.

4. The camera module according to claim 1 wherein a surface of the molding compound is flush with the first surface of the transparent cover.

5. The camera module according to claim 1 further comprising a lens assembly coupled to the first surface of the at least one semiconductor substrate.

6. The camera module according to claim 1, wherein the number of the semiconductor substrate is two, the two semiconductor substrates being disposed on opposite sides of the sensor assembly in the horizontal direction, respectively.

7. The camera module according to claim 1 wherein the number of the semiconductor substrate is one, whose cross-sectional shape is a hollow square, and the sensor assembly is located inside the semiconductor substrate.

8. The camera module according to claim 7 wherein the sensor assembly is disposed centrally within the semiconductor substrate.

9. The camera module according to claim 1 wherein the transparent cover is a glass having an IR coating or a UV coating.

10. A method, comprising:
    positioning alternately a plurality of sensor assemblies and a plurality of semiconductor substrates on a carrier layer at a predetermined spacing, wherein each of the plurality of sensor assemblies comprises:
  a semiconductor die;
  a sensor circuit disposed on a top surface of the semiconductor die; and
  a transparent cover coupled to the semiconductor die covering the top surface of the semiconductor die, wherein the semiconductor die comprises a through silicon via electrically coupled to the sensor circuit;
electrically coupling each through silicon via to a circuit in a corresponding semiconductor substrate of the plurality of semiconductor substrates from a bottom surface of the corresponding semiconductor substrate via a bonding wire while the plurality of sensor assemblies and the plurality of semiconductor substrates are on the carrier layer;
inserting molding compound between the plurality of semiconductor substrates and the plurality of sensor assemblies, the molding compound at least further covers each bonding wire and a bottom surface of each semiconductor die;
removing the carrier layer subsequent to inserting the molding compound;
dicing the plurality of semiconductor substrates to form monolithic structures; and
coupling a lens assembly over a top surface of at least one of the monolithic structures.

11. The method according to claim 10 wherein after removing the carrier layer and before dicing each semiconductor substrate, the method further comprises: mounting, on the top surface of the plurality of semiconductor substrates, surface mount devices electrically coupled to the circuit in the corresponding semiconductor substrate.

12. The method according to claim 10 wherein the transparent cover and the semiconductor die are aligned in a horizontal direction.

13. The method according to claim 10 wherein the thickness of each semiconductor substrate is approximately equal to the thickness of the sensor assembly.

14. A device, comprising:
  a die having a first surface and a second surface;
  a sensor circuit on the die;
  a transparent cover having a first surface and a second surface, the second surface of the transparent cover facing the first surface of the die; and
  a substrate having a first surface and a second surface, the substrate being positioned such that:
    the first surface of the substrate is substantially co-planar with the first surface of the transparent cover, and
    the second surface of the substrate is substantially co-planar with the second surface of the die.

15. The device of claim 14, further comprising a molding compound formed between the die and the substrate, on the second surface of the die, and on the second surface of the substrate, the molding compound having a surface that is substantially co-planar with the first surface of the transparent cover and the first surface of the substrate.

16. The device of claim 14, further comprising a wire having a first end and a second end, the first end electrically coupled to the second surface of the die, the second end electrically coupled to the second surface of the substrate.

17. The device of claim 14, further comprising an electrical component on the first surface of the substrate.

18. The device of claim 14 wherein the substrate encircles the die, the sensor circuit, and the transparent cover.

19. A device, comprising:
  a die having a first surface and a second surface;
  a sensor circuit on the die;
  a transparent cover having a first surface and a second surface, the second surface of the transparent cover facing the first surface of the die; and
  a substrate having a first surface and a second surface, the substrate being positioned such that:
    the first surface of the substrate is substantially co-planar with the first surface of the transparent cover, and
    the second surface of the substrate is substantially co-planar with the second surface of the die; and
  a wire having a first end and a second end, the first end electrically coupled to the second surface of the die, the second end electrically coupled to the second surface of the substrate.

20. The device of claim 19, further comprising a molding compound formed between the die and the substrate, on the second surface of the die, and on the second surface of the substrate, the molding compound having a surface that is substantially co-planar with the first surface of the transparent cover and the first surface of the substrate.

21. A device, comprising:
  a die having a first surface and a second surface;
  a sensor circuit on the die;
  a transparent cover having a first surface and a second surface, the second surface of the transparent cover facing the first surface of the die; and
  a substrate having a first surface and a second surface, the substrate encircles the die, the sensor circuit, and the transparent cover, the substrate being positioned such that:
    the first surface of the substrate is substantially co-planar with the first surface of the transparent cover, and
    the second surface of the substrate is substantially co-planar with the second surface of the die.

22. The device of claim 21, further comprising a molding compound formed between the die and the substrate, on the second surface of the die, and on the second surface of the substrate, the molding compound having a surface that is substantially co-planar with the first surface of the transparent cover and the first surface of the substrate.

* * * * *